United States Patent [19]

Pascucci

[11] Patent Number: 5,986,954

[45] Date of Patent: Nov. 16, 1999

[54] SELF-REGULATED EQUALIZER, PARTICULARLY FOR SENSE AMPLIFIERS

[75] Inventor: Luigi Pascucci, Sesto S. Giovanni, Italy

[73] Assignee: STMicroelectronics S.R.L., Agrate Brianza, Italy

[21] Appl. No.: 08/960,926

[22] Filed: Oct. 30, 1997

[30] Foreign Application Priority Data

Oct. 31, 1996 [IT] Italy .................................. MI96A2259

[51] Int. Cl.$^6$ .................................................. G11C 7/00
[52] U.S. Cl. ........................ 365/203; 365/204; 365/205; 365/185.25
[58] Field of Search .................................. 365/203, 204, 365/185.25

[56] References Cited

U.S. PATENT DOCUMENTS 5,255,223  10/1993  Tanaka et al. ..................... 365/189.09
5,604,704  2/1997  Atsumo .................................. 365/203
5,623,446  4/1997  Hisada et al. ......................... 365/203
5,640,350  6/1997  Iga ........................................ 365/203
5,737,268  4/1998  Pascucci ................................ 365/203
5,828,611  10/1998  Kaneko et al. ...................... 365/203

*Primary Examiner*—David Nelms
*Assistant Examiner*—Tuan T. Nguyen
*Attorney, Agent, or Firm*—Seed and Berry LLP; David V. Carlson

[57] ABSTRACT

The invention relates to a self-regulated equalizer of the type which comprises a load circuit placed between first and second voltage references and having an input terminal which is connected to a modulated supply line, itself connected to the first voltage reference through a voltage step-up block placed between the first voltage reference and the modulated supply line and synchronized by a precharge enable signal received on a control terminal.

22 Claims, 2 Drawing Sheets

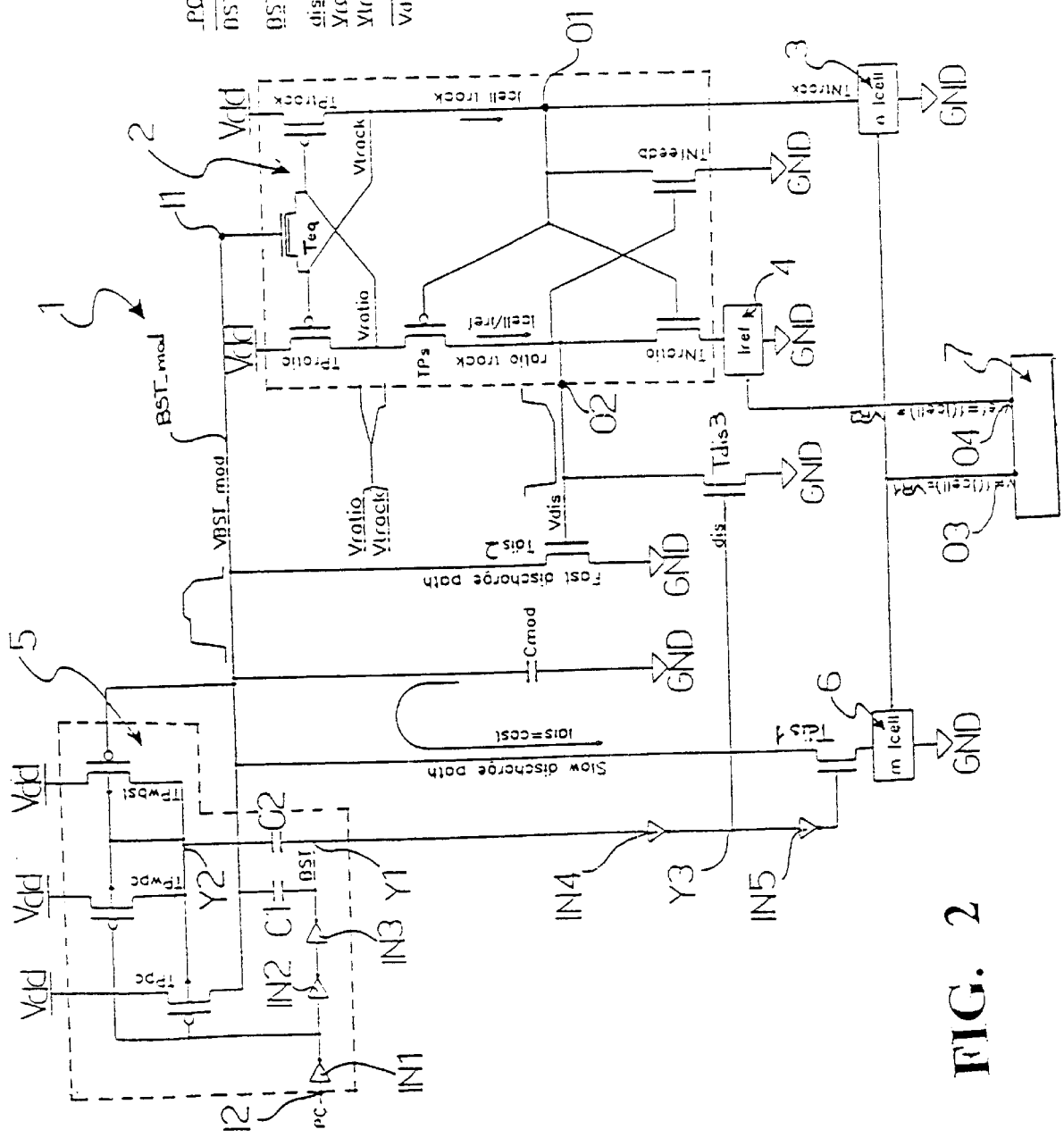

SELF-REGULATED EQUALIZER, PARTICULARLY FOR SENSE AMPLIFIERS

FIELD OF THE INVENTION

This invention relates to a self-regulated equalizer.

The invention more particularly concerns a self-regulated equalizer of a type which comprises a load circuit connected between first and second voltages references and having an input terminal.

BACKGROUND OF THE INVENTION

As is well known, memory devices usually include sense amplifiers of either the register or latch type, that is, circuits which are capable of reading data from a memory and retaining it for a given time period.

A known type of sense amplifier SA is depicted in FIG. 1. The sense amplifier SA comprises a latch circuit LA placed between a supply voltage reference Vdd and an internal circuit node X. The latch circuit LA has first IN1' and second IN2' input terminals, as well as first OUT_L and second OUT_R output terminals, respectively connected to first M1 and second Mr memory cells.

In fact, the sense amplifier SA is commonly used for reading from memory cells M1, the contents whereof are compared to those of reference memory cells Mr, specifically non-programmed or "virgin" cells.

Accordingly, the sense amplifier SA basically comprises a read leg RR1, which is taken to the memory cell M1 and has a read current I1 flowed therethrough, and a reference leg RRr, which is taken to the reference memory cell Mr and has a reference current Ir flowed therethrough. Both legs RR1 and RRr are connected to the latch circuit LA.

In addition, the latch circuit LA comprises first Tp1 and second Tn1 read transistors which are connected, in series with each other, between the supply voltage reference Vdd and the internal circuit node X and have their control terminals connected together and to the second output terminal OUT_R.

In the embodiment shown in FIG. 1, the first read transistor Tp1 is a p-channel MOS transistor, or PMOS transistor, while the second read transistor Tn1 is an n-channel MOS transistor, or NMOS transistor.

Similarly, the latch circuit LA comprises first Tpr and second Tnr reference transistors which are connected, in series with each other, between the supply voltage reference Vdd and the circuit node X, and have their control terminals connected together and to the first output terminal OUT_L.

In the embodiment shown in FIG. 1, the first reference transistor Tpr is a PMOS transistor, and the second reference transistor Tnr is an NMOS transistor.

Furthermore, the first OUT_L and second OUT_R output terminals are respectively connected to the common drain terminals of the read transistors Tp1, Tn1 and of the reference transistors Tpr, Tnr, as well as to the supply voltage reference Vdd via first Tpc1 and second Tpcr control transistors. These control transistors are, in turn, connected between said output terminals OUT_L, OUT_R and the supply voltage reference Vdd and have their control terminals connected to the first IN1' and second IN2' input terminals of the latch circuit LA.

In particular, the control transistors Tpc1 and Tpcr are PMOS transistors.

The sense amplifier SA further comprises an equalization block BE which is connected between the first OUT_L and second OUT_R output terminals and connected to the circuit node X, the latter having an equalization signal EQ present thereon. This equalization block BE is operative to prevent unbalance between the voltages at the output terminals OUT_L and OUT_R.

The sense amplifier SA has positive feedback between the aforesaid output terminals OUT_L and OUT_R. Hence, the equalization of the output terminals OUT_L and OUT_R needs to be as accurate as possible, since any unbalance between the voltages presented at such terminals would have irreparable consequences on the operation of the sense amplifier SA.

Lack of equalization would indeed result in a situation of bistability of the latch circuit, with a consequent risk of altered reading. In particular, the condition of perfect equalization should be achieved at the pre-reading stage.

The equalization block BE of the sense amplifier SA of FIG. 1 basically comprises an NMOS transistor Tne.

It should be noted that the required equalization function cannot be obtained from a PMOS transistor due to the presence of capacitive couplings (tied to Miller's capacitance) introducing a disturbance which could overlay the useful signal.

While offering a number of advantageous features, such as modulability of the sense amplifier SA gain, this prior art solution based on the use of NMOS-type transistors is still beset with a number of problems, especially operating at high voltages.

In fact, the threshold value of the equalization transistor Tne rises due to the so-called "body effect". This rise does not present a problem at low voltages (where the threshold voltage of the transistor Tne goes from 0.4 to 0.6 V), but becomes objectionable at high voltages (where the threshold voltage of the transistor Tne goes from 0.4 to 1–1.5 V), approaching the working point of the latch circuit LA, which has a quite high working point due to the presence of the PMOS transistors Tp1 and Tpr. Actually, these transistors Tp1 and Tpr must be highly conductive in order to rapidly precharge the latch circuit LA, this being a vital function to a correct reading.

By setting a high working point for the sense amplifier SA, the use of highly conductive transistors results in poor equalization of the whole circuit in conjunction with the aforesaid "body effect".

The equalization signal EQ is also effective to catch data, thereby allowing the sensitivity of the sense amplifier SA to be adjusted by modulating its slope. Thus, for circuits which employ sense amplifiers of the latching type, an effective equalization of the output terminals of the latch circuit is essential. Also valuable is the ability to modify the equalization conditions in a "gradual" manner, so as to reduce disturbances due to parasitic couplings (referred to as "Miller's Effect" in the literature), and especially to build a signal which, albeit weak, can be detected reliably and stored correctly.

Accordingly, it is important to situate the appropriate moment for a quick and accurate capture of given data. This moment must be preceded by an absolutely perfect equalization and be as immediate as possible with respect to the reading operations, so as to avoid a time-consuming initial step of building up the output signal from the sense amplifier, which is liable to lengthen the reading time considerably.

SUMMARY OF THE INVENTION

An object of this invention is to provide an equalizer circuit, particularly intended for sense amplifiers, which has such structural and functional features as to enable the profile of equalization to be related to the characteristics of the currents present within the system, as mainly determined by the conductivity of the cells connected in the system, thereby overcoming the drawbacks that still beset prior art equalizers.

The underlying solution provided by this invention is one of boosting a supply voltage to the equalizer so as to increase the conductivity of transistors which comprise the equalizer, and ensure a perfect equalization, even at a very high working point of a sense amplifier, while allowing reading circuits of the equalizer to be modulated in a manner "related to the conductivity of the memory cells" and the read data "to be caught at a faster rate".

According to principles of the present invention, the technical problem is solved by a self-regulated equalizer circuit which comprises a load circuit placed between first and second voltage references and having an input terminal, wherein said input terminal of the load circuit is connected to a modulated supply line, itself connected to the first voltage reference through a voltage step-up block placed between the first voltage reference and the modulated supply line and synchronized by a precharge enable signal received on a control terminal.

The features and advantages of the self-regulated equalizer according to this invention will become more clearly apparent from the following description of an embodiment thereof, given by way of non-limiting example with reference to the accompanying drawings.

BRIEF DESCRIPTION OF THE DRAWINGS

FIG. 2 shows a self-regulated equalizer circuit according to the invention;

FIG. 3 is a detail view of part of the equalizer shown in FIG. 2; and

FIG. 4 shows the shapes versus time, plotted on a common time base, of signals present in the equalizer of FIG. 2.

DETAILED DESCRIPTION OF THE INVENTION

Figure 1:
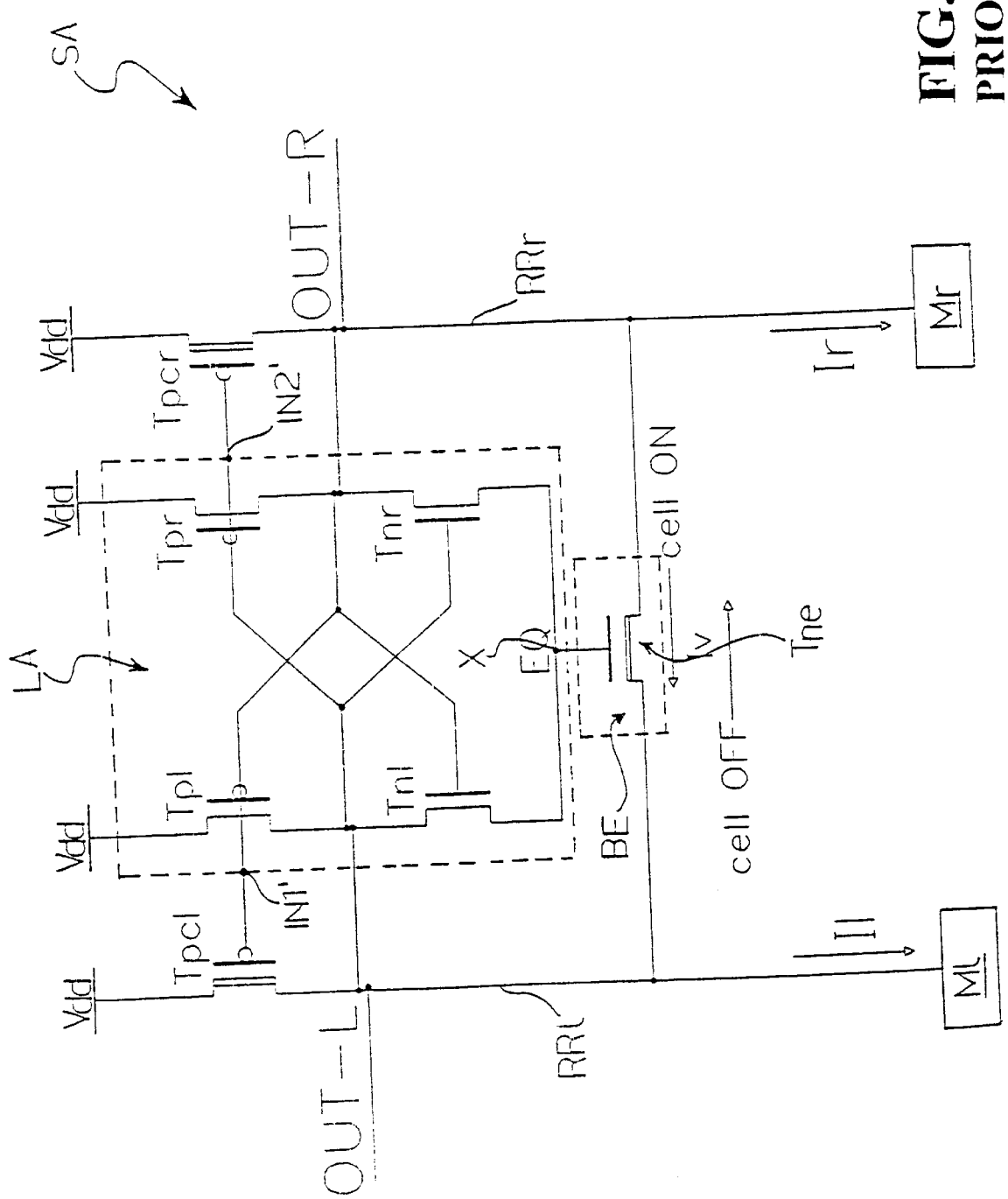
FIG. 1 shows schematically a sense amplifier which has been equalized in accordance with the prior art.

FIG. 2 generally and schematically shows a self-regulated equalizer circuit for sense amplifiers which embodies this invention.

In particular, the self-regulated equalizer 1 comprises a load circuit 2 placed between a first voltage reference Vdd and a second voltage reference, specifically a signal ground GND, and having an input terminal I1 which is connected to a modulated supply line BST_mod, as well as first O1 and second O2 output terminals which are connected to the ground GND through a first reference cell circuit 3 and a second reference cell circuit 4, respectively.

Advantageously, the load circuit 2 is constructed and dimensioned as a load circuit for a sense amplifier. It comprises a tracking leg through which a track current Icell_track is flowed, and a reference leg through which a reference current Icell_ref is flowed.

In particular, the load circuit 2 comprises a tracking transistor TPtrack and a reference transistor TPratio, which are connected between the supply voltage reference Vdd and the first O1 and second O2 output terminals, respectively. In particular, the control terminal of the tracking transistor TPtrack is taken to the drain terminal of the reference transistor TPratio, and vice versa. Also, the reference transistor TPratio is connected to the second output terminal O2 via a decoupling transistor TPs.

The load circuit 2 further comprises a second reference transistor TNratio, which is connected between the second output terminal O2 and the second reference cell circuit 4, as well as a feedback transistor TNfeedb placed between the first output terminal O1 and the ground GND.

In particular, the feedback transistor TNfeedb has its control terminal connected to the second output terminal O2, while the decoupling transistor TPs and second reference transistor TNratio have their control terminals connected to each other and to the first output terminal O1, itself connected to the first reference cell circuit 3.

In the embodiment shown in FIG. 2, the tracking transistor TPtrack, reference transistor TPratio, and decoupling transistor TPs are PMOS transistors, whereas the second reference transistor TNratio and feedback transistor TNfeedb are NMOS transistors.

To duplicate the construction of a sense amplifier, the load circuit 2 further comprises an equalization transistor Teq placed between the control terminals of the reference transistor TPratio and the tracking transistor TPtrack and having a control terminal connected to the modulated supply line BST_mod, located at the input terminal I1 of the load circuit 2.

In the embodiment of FIG. 2, the equalization transistor Teq is an NMOS transistor. However, a corrected threshold (LVS) MOS transistor could be used instead.

The self-regulated equalizer 1 also comprises a voltage step-up block 5 connected between the supply voltage reference Vdd and the modulated supply line BST_mod. The voltage step-up block 5 is synchronized by a signal enabling a precharging step PC for the sense amplifier and being received on a control terminal I2.

The voltage step-up block 5 comprises first TPpc, second TPwpc and third TPwbst enable transistors which are connected between the supply voltage reference Vdd and the modulated supply line BST_mod. The first enable transistor TPpc is connected to a first bootstrap capacitor C1 and to the modulated supply line BST_mod. The second TPwpc and third TPwbst enable transistors are connected together and to a second bootstrap capacitors C2. The first C1 and second C2 bootstrap capacitors are connected to a first internal circuit node Y1 whereat a stepped-up voltage signal BST is presented.

In particular, the first enable transistor TPpc has a control terminal connected to the control terminal I2 of the voltage step-up block 5 through a first logic inverter IN1 and to a control terminal of the second enable transistor TPwpc.

In addition, the second TPwpc and third TPwbst enable transistors have their bulk terminals connected to each other, as well as to their respective drain terminals, the bulk terminal of the first enable transistor TPpc, and a second internal circuit node Y2, itself connected to the first internal circuit node Y1 through the second bootstrap capacitor C2, while the first bootstrap capacitor C1 is connected between the modulated supply line BST_mod and the first internal circuit node Y1.

The third enable transistor TPwbst, moreover, has a control terminal connected to the modulated supply line BST_mod.

Finally, the control terminal I2 of the voltage step-up block 5 is connected to the first internal circuit node Y1 through a series of the first logic inverter IN1, second IN2 and third IN3 logic inverters.

The self-regulated equalizer 1 comprises a first discharging transistor Tdis1 connected between the modulated supply line BST_mod and, through a further reference cell circuit 6, the ground GND.

This first discharging transistor Tdis1 has a control terminal connected to the first internal circuit node Y1 via a series of a fourth IN4 and a fifth IN5 logic inverters, jointly connected to a third internal circuit node Y3.

Advantageously in this invention, the self-regulated equalizer 1 further comprises second Tdis2 and third Tdis3 discharging transistors. In particular, the second discharging transistor Tdis2 is connected between the modulated supply line BST_mod and the ground GND, and has a control terminal connected to the second output terminal O2 of the load circuit 2, while the third discharging transistor Tdis3 is connected between said output terminal O2 and the ground GND and has a control terminal connected to the third internal circuit node Y3.

The self-regulated equalizer 1 further comprises a modulation capacitor Cmod connected between the modulated supply line BST_mod and the ground GND.

In the embodiment shown in FIG. 2, the first, second and third discharging transistors Tdis1, Tdis2 and Tdis3 are all NMOS transistors.

Advantageously in this invention, the self-regulated equalizer 1 also comprises a reference voltage generator 7 which has a first output terminal O3 delivering a first reference voltage VR1 and being connected to the first reference cell circuit 3 and the third reference cell circuit 6, and a second output terminal O4 delivering a second reference voltage VR2 and being connected to the second reference cell circuit 4.

Thus, the reference voltages supplied by the reference voltage generator 7 are suitably related to the technological and bias conditions of a respective cell within a memory.

The first 3, second 4 and third 6 reference cells comprise a plurality of transistors, specifically parallel-connected MOS transistors, reflecting the conductivity of storage elements of the respective cells, as shown in FIG. 3. These cell circuits can, therefore, be likened to multiple memory cells connected in parallel.

The operation of the self-regulated equalizer of this invention will now be described with specific reference to the timing patterns, shown in FIG. 4, of the signals presented within the equalizer.

First, the rest condition is characterized by the following configuration:

```
PC = GND
dis = GND
VBST_mod = GND
Vtrack = GND
Vdis = Vdd
EV_en = Vdd
VR1 = Vdd
VR2 = GND
``` where,

PC is the precharge enable signal for the sense amplifier, being utilized as a synchronization signal for the voltage step-up block 5;

dis is a voltage signal presented at the third internal circuit node Y3 and applied to the control terminal of the third discharging transistor Tdis3;

VBST_mod is the modulated supply signal presented on the modulated voltage line BST_mod;

Vtrack is a voltage at the first output terminal O1 of the load circuit 2;

Vdis is a voltage at the control terminal of the second discharging transistor Tdis2;

EV_en is an enable signal for a discharging event on the modulated supply line BST_mod;

VR1 is the first reference voltage at the first output terminal O3 of the reference voltage generator 7; and VR2 is the second reference voltage at the second output terminal O4 of the reference voltage generator 7.

Activation includes a first "precharging" step which activates the following configuration:

```
PC = Vdd
dis = Vdd
VBST_mod = Vdd
Vtrack = Vdd − VTpch = Vratio
Vdis = Vdd
EV_en = GND
VR1 = Vf(Icell)
VR2 = Vref = cost (−2V)
``` where,

VTpch is a threshold voltage of the tracking transistor TPtrack included in the load circuit 2.

At the end of the precharging step, the precharge enable signal PC goes to its high level (equal to the supply voltage Vdd), causing a quick overshoot in the modulated supply line BST_mod.

In fact, the signal PC, as negated through the first logic inverter IN1, will turn on the first TPpc and second TPwpc enable transistors of the voltage step-up block 5.

With the stepped-up voltage signal BST at zero on the first circuit node Y1, the turning on of the enable transistors TPpc and TPwpc connected to said node Y1 will cause the bootstrap capacitors C1 and C2 to be precharged.

Concurrently therewith, the voltage signal dis presented on the third internal circuit node Y3 goes to a logic 1 through the fourth logic inverter IN4, and will bring to zero the voltage Vdis at the control terminal of the second discharge transistor Tdis2.

With the voltage Vdis being also applied to the second output terminal O2 of the load circuit 2, a current will be presented at the input of the reference cell circuit 3 which is n times as large as the current Icell of one reference cell, no current Icell-track being passed through the tracking transistor TPtrack.

Under these conditions, the equalization transistor Teq will equalize the control gate terminals of the tracking transistor TPtrack and the reference transistor TPratio, the decoupling transistor TPs being now in the off state. The equalization transistor Teq of the load circuit 2 of the self-regulated equalizer 1 is, therefore controlled in the same way as the equalization transistor Tne of a prior art sense amplifier SA.

At the end of the activation, the precharge signal PC will go back to zero, thereby bringing a logic level 1 to the control terminals of the first TPpc and second TPwpc enable transistors in the voltage step-up block 5. The TPpc and TPwpc transistors then been turned off. The first and second internal circuit nodes Y1 and Y2 are thus isolated.

The first bootstrap capacitor C1 causes, once suitably precharged, a further rise in the modulated supply line BST_mod, and the second bootstrap capacitor C2 produces a rise in the n-well line of the PMOS enable transistors TPpc, TPwpc and TPwbst, thereby preventing any direct paths.

By means of the fourth logic inverter IN4, the voltage signal dis on the third internal circuit node Y3 is then disabled, and the first discharging transistor Tdis1 is enabled to trigger on a first discharge path (designated the "slow discharge path") for the modulated supply line BST_mod, through the modulation capacitor Cmod and the first discharging transistor Tdis1.

The signal EV_en enabling a discharge event goes to a level of 1, indicating that the first discharge path has been enabled.

The discharging of the modulation capacitor Cmod occurs at a constant current Idis which is controlled by the first reference voltage VR1 from the reference voltage generator 7 through the third reference cell circuit 6. The reference cell circuit 6 has a conductivity relating to that of a memory cell.

The voltage drop on the modulated supply line BST_mod attenuates the equalization of the control gate terminals of the tracking transistor TPtrack and the reference transistor TPratio. The TPtrack and TPratio transistors will stay on during this discharge step.

The current Icell_track, related to the conductivity of a memory cell, flowed through the tracking transistor TPtrack causes a voltage Vtrack at the first output terminal O1 of the load circuit 2 to drop, and a voltage Vratio at the drain terminal of the reference transistor TPratio to rise with the assistance of the concurrent reduction in the equalizing action of the modulated-supply signal VBST_mod present on the modulated supply line BST_mod.

Upon the voltage Vratio reaching a logic level 1, the tracking transistor TPtrack is turned off, thereby assisting in the voltage Vtrack drop at the first output terminal O1 of the load circuit 2, effective to turn on the decoupling transistor TPs.

The decoupling transistor TPs drives a current Iref from the second reference cell circuits 4, and brings up the level of the voltage Vdis at the control terminal of the second discharging transistor Tdis2.

The rise of the voltage Vdis, slow at first, is sharply accelerated once the second discharge transistor Tdis 2 passes its threshold voltage value. Thus, a second discharge path (designated the "fast discharge path") is triggered on for the modulated supply line BST_mod through the second discharging transistor Tdis2, thereby speeding up the transient state. This would only occur once the conditions are reproduced for positively catching read data, so that the discharge step can be limited to no more than the time needed for building the equalization signal.

The discharging of the modulated supply line BST_mod is further accelerated by the positive feedback of the load circuit 2, similar to conventional sense amplifiers.

Thus, it can be stated that the modulated-supply signal VBST_mod serves well its function as an equalization signal for the load circuit 2; in fact, it is suitably bootstrapped above the supply voltage, while compensating for and suppressing the body effect phenomenon.

In addition, the equalizer 1 is self-regulated, since it can decide the discharge rate of the equalization line without the aid of external signals, and rely on reference currents which are related to the conductivity of any one cell modulated by the reference voltage generator 7 generating the reference voltages according to the device bias, technology, and operating temperature, as presented back by the third reference cell circuit 6 which controls the discharge slope of the modulated supply line BST_mod. In particular, the equalizer of this invention, by having a "duplicated" portion with respect to the transistors used in the reference cell circuits, can also be used with memory cells of changing design as technology advances.

This modulation is controlled simultaneously on the basis of the reference voltages through the reference cell circuits 6, 3 and 4 respectively controlling the constant discharge, tracking path of the sense amplifier current, and ratio of the point where the slope of the sense amplifier characteristic is to be changed by a suitable margin.

Finally, the modulation of the slope of the equalizer 1 can be set by acting on the number (n, m, k) of transistors used for the first, second and third reference cell circuits 3, 4 and 6.

In conclusion, the following are major advantages provided by the equalizer of this invention:

the equalization signal VBST_mod, as suitably bootstrapped above the supply voltage, allows the gain of the sense amplifier to be modulated, thereby making solutions of the CMOS type, i.e., combinations of NMOS and PMOS transistors, unnecessary;

this modulation is limited to the development of an intelligible signal;

the catching of data by the equalizer occurs rapidly following modulation of the sense amplifier;

the modulation, as simultaneously controlled on the basis of reference voltages by building constant discharge tracking and ratio paths, is related to the actual characteristics of memory cell conductivity by the use, in the equalizer, of a "duplicated" portion with respect to the memory device.

What is claimed is:

1. A self-regulated equalizer comprising:
   a load circuit placed between first and second voltage references and having an input terminal, the load circuit comprising:
      a tracking transistor and a reference transistor, connected between the first voltage reference and respectively first and second output terminals, having respective control terminals connected to their respective drain terminals, and an equalization transistor connected between the control terminals of the reference transistor and the tracking transistor and having a control terminal connected to the input terminal of the load circuit; and
      a decoupling transistor connected between the reference transistor and the second output terminal and having its control terminal connected to the first output terminal of the load circuit;
   a modulated supply line connected to said input terminal; and
   a voltage step-up block being placed between the first voltage reference and the modulated supply line and synchronized by a precharge enable signal received on a control terminal.

2. The self-regulated equalizer according to claim 1, wherein the voltage step-up block comprises first, second and third enable transistors connected to the modulated supply line, the first enable transistor being connected between the first voltage reference and the modulated supply line, and having a control terminal connected to the control terminal of the voltage step-up block through a first logic inverter, and the second and third enable transistors being connected between the first voltage reference and a body of the first enable transistor.

3. A self-regulated equalizer comprising:
   a load circuit placed between first and second voltage references and having an input terminal;
   a modulated supply line connected to said input terminal; and
   a voltage step-up block being placed between the first voltage reference and the modulated supply line and synchronized by a precharge enable signal received on a control terminal, wherein the load circuit further comprises a tracking transistor and a reference transistor, connected between the first voltage reference and respectively first and second output terminals, having respective control terminals connected to their respective drain terminals, and an equalization transistor connected between the control terminals of the reference transistor and the tracking transistor and having a control terminal connected to the input terminal of the load circuit, and wherein the load circuit further comprises a decoupling transistor connected between the reference transistor and the second output terminal and having its control terminal connected to the first output terminal of the load circuit, and wherein the voltage step-up block comprises first, second and third enable transistors connected to the modulated supply line, the first enable transistor being connected between the first voltage reference and the modulated supply line, and having a control terminal connected to the control terminal of the voltage step-up block through a first logic inverter, and the second and third enable transistors being connected between the first voltage reference and a circuit node, and wherein the first enable transistor has its control terminal further connected to the control terminal of the second enable transistor and its bulk terminal connected to the circuit node, and that the second and third enable transistors have their bulk terminals connected together, to their respective drain terminals, and to the circuit node, the third enable transistor also having a control terminal connected to the modulated supply line.

4. A self-regulated equalizer comprising:

a load circuit placed between first and second voltage references and having an input terminal;

a modulated supply line connected to said input terminal; and a voltage step-up block being placed between the first voltage reference and the modulated supply line and synchronized by a precharge enable signal received on a control terminal, wherein the load circuit further comprises a tracking transistor and a reference transistor, connected between the first voltage reference and respectively first and second output terminals, having respective control terminals connected to their respective drain terminals, and an equalization transistor connected between the control terminals of the reference transistor and the tracking transistor and having a control terminal connected to the input terminal of the load circuit, and wherein the load circuit further comprises a decoupling transistor connected between the reference transistor and the second output terminal and having its control terminal connected to the first output terminal of the load circuit, and wherein the voltage step-up block comprises first, second and third enable transistors connected to the modulated supply line, the first enable transistor being connected between the first voltage reference and the modulated supply line, and having a control terminal connected to the control terminal of the voltage step-up block through a first logic inverter, and the second and third enable transistors being connected between the first voltage reference and a circuit node, and wherein the voltage step-up block comprises a first bootstrap capacitor connected between the modulated supply line and a further circuit node, and a second bootstrap capacitor connected between the circuit node and the further circuit node being applied a stepped-up voltage signal.

5. The self-regulated equalizer according to claim 4, wherein the modulated supply line is connected to the second voltage reference through first and second discharge transistors, and through a modulation capacitor, the first discharge transistor having its control terminal connected to the further circuit node through second and third logic inverters, and the second discharge transistor having its control terminal connected to the second output terminal of the load circuit and to the second voltage reference through a third discharge transistor.

6. The self-regulated equalizer according to claim 5, wherein the third discharge transistor has its control terminal connected to the further circuit node through the second logic inverter, and to the control terminal of the first discharge transistor through the third logic inverter.

7. The self-regulated equalizer according to claim 6, wherein it comprises a first reference cell circuit connected between the first output terminal of the load circuit and the second voltage reference, a second reference cell circuit connected between the second output terminal of the load circuit and the second voltage reference, and a third reference cell circuit connected between the first discharge transistor and the second voltage reference.

8. The self-regulated equalizer according to claim 7, wherein the self-regulated equalizer comprises a reference voltage generator having a first output terminal which delivers a third reference voltage and is connected to the first and third reference cell circuits, and a second output terminal which delivers a fourth reference voltage and is connected to the second reference cell circuit.

9. The self-regulated equalizer according to claim 8, wherein the first, second and third reference cell circuits comprise a plurality of transistors reproducing a conductivity related to the number of transistors of each cell.

10. An equalization method for a self-regulated equalizer comprising a load circuit placed between first and second voltage references and having an input terminal, wherein the equalization method comprises the following steps:

precharging a modulated supply line connected to the input terminal of the load circuit, the step of precharging the modulated supply line being activated by switching a precharge enable signal to a high logic level which causes a quick overshooting on the modulated supply line;

precharging first and second bootstrap capacitors, connected between a stepped-up voltage line and respectively the first voltage reference and the modulated supply line;

equalizing the control terminals of a tracking transistor and a reference transistor connected between the first voltage reference and respectively first and second output terminals of the load circuit through an equalization transistor connected between said control terminals of the tracking and reference transistors and having its control terminal connected to the modulated supply line;

stepping up the modulated supply line by switching the precharge enable signal to a low logic level through the first bootstrap capacitor as suitably precharged;

first discharging the modulated supply line at a slow rate, through a modulation capacitor and a first discharge transistor, both connected between the modulated supply line and the second voltage reference; and discharging the modulated supply line at a fast rate, through a second discharge transistor.

11. The equalization method for a self-regulated equalizer according to claim 10, wherein the step of discharging the modulated supply line at a fast rate is depended on a reference current internal of the self-regulated equalizer.

12. The equalization method for a self-regulated equalizer according to claim 11, wherein the step of discharging the modulated supply line at a fast rate can be controlled by acting on numbers of transistors employed in the construction of first, second and third reference cell circuits included in the self-regulated equalizer.

13. A self-regulated equalizer comprising:

a load circuit;

a voltage step-up circuit connected to the load circuit, comprising a first inverter circuit;

a first enable transistor circuit connected between the first voltage reference and the modulated supply line, the first enable transistor circuit having a control terminal connected to the control terminal of the voltage step-up circuit through the first inverter circuit;

a second enable transistor circuit connected to the first voltage reference, the second enable transistor circuit having a control terminal connected to the control terminal of the first enable transistor circuit; and a third enable transistor circuit connected to the modulated supply line and to the first voltage reference;

a discharging circuit connected to the voltage step-up circuit and to the load circuit;

a voltage generating circuit connected to the discharging circuit, to the voltage step-up circuit, and to the load circuit;

first and second voltage references, wherein the load circuit is connected between the first and second voltage references and comprises an input terminal connected to the voltage step-up circuit through a modulated supply line, the voltage step-up circuit comprising a control terminal synchronized by a precharge enable signal; and a first bootstrap capacitor circuit connected between the modulated supply line and a first circuit node, wherein the first circuit node is connected to the control terminal of the voltage step-up circuit through the first inverter circuit; and a second bootstrap capacitor circuit connected between the first circuit node and a second circuit node.

14. A self-regulated equalizer comprising:

a load circuit;

a voltage step-up circuit connected to the load circuit, comprising a first inverter circuit;

a first enable transistor circuit connected between the first voltage reference and the modulated supply line, the first enable transistor circuit having a control terminal connected to the control terminal of the voltage step-up circuit through the first inverter circuit;

a second enable transistor circuit connected to the first voltage reference, the second enable transistor circuit having a control terminal connected to the control terminal of the first enable transistor circuit; and a third enable transistor circuit connected to the modulated supply line and to the first voltage reference;

a discharging circuit connected to the voltage step-up circuit and to the load circuit;

a voltage generating circuit connected to the discharging circuit, to the voltage step-up circuit, and to the load circuit;

first and second voltage references, wherein the load circuit is connected between the first and second voltage references and comprises an input terminal connected to the voltage step-up circuit through a modulated supply line, the voltage step-up circuit comprising a control terminal synchronized by a precharge enable signal; and wherein the first, second and third enable transistor circuits respectively further comprise first, second and third bulk terminals, the first bulk terminal being connected to the second circuit node, the respective bulk terminals of the second and third enable transistor circuits are connected together, to their respective drain terminals, and to the second circuit node, the third enable transistor circuit having a control terminal connected to the modulated supply line.

15. A self-regulated equalizer comprising:

a load circuit;

a voltage step-up circuit connected to the load circuit;

a discharging circuit connected to the voltage step-up circuit and to the load circuit wherein the discharging circuit comprises:

a second inverter circuit connected to the first circuit node;

third inverter circuit connected in series to the second inverter circuit;

a modulate capacitor circuit connected between the modulated supply line and the second voltage reference;

a first discharge transistor circuit connected between the modulated supply line and the second voltage reference, the first discharge transistor circuit having a control terminal connected to the first circuit node through the second and third inverter circuits;

a second discharge transistor circuit connected between the modulated supply line and the second voltage reference, the second discharge transistor circuit having a control terminal connected to the second output terminal of the load circuit; and a third discharge transistor circuit connected between the second voltage reference and the control terminal of the second discharge transistor circuit, the third discharge transistor circuit having a control terminal connected to the first circuit node through the second inverter circuit and to the control terminal of the first discharge transistor circuit through the third inverter circuit;

a voltage generating circuit connected to the discharging circuit, to the voltage step-up circuit, and to the load circuit; and first and second voltage references, wherein the load circuit is connected between the first and second voltage references and comprises an input terminal connected to the voltage step-up circuit through a modulated supply line, the voltage step-up circuit comprising a control terminal synchronized by a precharge enable signal.

16. The self-regulated equalizer of claim 15, wherein the voltage generating circuit comprise:

a first reference cell circuit connected between the first output terminal of the load circuit and the second voltage reference;

a second reference cell circuit connected between the second output terminal of the load circuit and the second voltage reference;

a third reference cell circuit connected between the first discharge transistor circuit and the second voltage reference.

17. The self-regulated equalizer of claim 16, wherein the voltage generating circuit comprises a reference voltage generator having a first output terminal connected to the first and third reference cell circuits, and a second output terminal connected to the second reference cell circuit.

18. The self-regulated equalizer of claim 17, wherein the first, second and third reference cell circuits respectively comprises a plurality of transistor circuits and produces a conductivity related to the number of transistors employed by each reference cell circuit respectively.

19. A method for self-regulating equalization of a sense amplifier, the method comprising:

switching a precharge enable signal received by a voltage step-up circuit of a self-regulated equalizer to logic level high;

precharging a modulated supply line connected to the voltage step-up circuit and to an input terminal of a load circuit;

precharging a first bootstrap capacitor connected between the modulated supply line and a first internal circuit node within the voltage step-up circuit, and precharging a second bootstrap capacitor connected between a first voltage reference and the first internal circuit node;

equalizing control terminals of a tracking transistor and a reference transistor, connected between the first voltage reference and respectively first and second output terminals of the load circuit, by an equalization transistor connected between control terminals of the tracking and reference transistors and having its control terminal connected to the modulated supply line;

stepping up the modulated supply line by switching the precharge enable signal to logic level low through the first bootstrap capacitor as suitably precharged;

discharging the modulated supply line at a slow rate, through a modulated capacitor and a first discharge transistor both connected between the modulated supply line and a second voltage reference; and discharging the modulated supply line at a fast rate, through a second discharge transistor connected between the modulated supply line and the second voltage reference and having a control terminal connected to the second output terminal of the load circuit.

20. The method for self-regulating equalization of a sense amplifier of claim 19, wherein the step of discharging the modulated supply line at a fast rate is depended upon a reference current internal of the self-regulated equalizer.

21. The method for self-regulating equalization of a sense amplifier of claim 20, wherein the step of discharging the modulated supply line at a fast rate is controlled by numbers of transistors employed respectively in the construction of first, second, and third reference cell circuits included in the self-regulated equalizer.

22. A self-regulated equalizer, comprising:

a load circuit placed between first and second voltage references and having an input terminal;

a modulated supply line connected to said input terminal and connected to the second voltage reference through first and second discharge transistors, and through a modulation capacitor, the first discharge transistor having its control terminal connected to a further circuit node through first and second logic inverters, and the second discharge transistor having its control terminal connected to the second output terminal of the load circuit and to the second voltage reference through a third discharge transistor, the third discharge transistor having its control terminal connected to the further circuit node through the first logic inverter, and to the control terminal of the first discharge transistor through the second logic inverter; and a voltage step-up block being placed between the first voltage reference and the modulated supply line and synchronized by a precharge enable signal received on a control terminal.

* * * * *